United States Patent
Baek et al.

(10) Patent No.: US 7,498,262 B2
(45) Date of Patent: Mar. 3, 2009

(54) METHOD OF FABRICATING A THIN FILM AND METAL WIRING IN A SEMICONDUCTOR DEVICE

(75) Inventors: In-Cheol Baek, Seoul (KR); Han-Choon Lee, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 265 days.

(21) Appl. No.: 11/566,034

(22) Filed: Dec. 1, 2006

(65) Prior Publication Data
US 2007/0155169 A1      Jul. 5, 2007

(30) Foreign Application Priority Data
Dec. 29, 2005  (KR)  .................. 10-2005-0134355

(51) Int. Cl.
*H01L 21/84*  (2006.01)

(52) U.S. Cl. .................. 438/685; 438/686; 438/687; 438/785; 257/E21.576

(58) Field of Classification Search .................. 438/685, 438/687, 698, 796; 257/E21.177, E21.241, 257/E21.576
See application file for complete search history.

(56) References Cited

U.S. PATENT DOCUMENTS

2004/0038529 A1*  2/2004  Soininen et al. ............. 438/685

* cited by examiner

*Primary Examiner*—Michael S Lebentritt
(74) *Attorney, Agent, or Firm*—Sherr & Vaughn, PLLC

(57) ABSTRACT

A method for forming a thin film of a semiconductor device, which may include at least one of the following steps: Forming a Tantalum Nitride (TaN) film over a semiconductor substrate by atomic layer deposition. Forming a Tantalum (Ta) film by converting at least a portion of a Tantalum Nitride (TaN) film into Tantalum (Ta) by soaking the TaN film in a diluted $HNO_3$ solution.

19 Claims, 4 Drawing Sheets

METHOD OF FABRICATING A THIN FILM AND METAL WIRING IN A SEMICONDUCTOR DEVICE

The present application claims priority under 35 U.S.C. 119 and 35 U.S.C. 365 to Korean Patent Application No. 10-2005-0134355 (filed on Dec. 29, 2005), which is hereby incorporated by reference in its entirety.

BACKGROUND

In high-speed and/or high-integration semiconductor devices, metal wiring may be finer and/or may have multiple layers. As widths of metal wiring are reduced, signal delay may occur due to the resistance and the capacitance of the metal wiring. To reduce signal delay, Copper having a low resistance may be employed as part of metal wiring.

Copper is relatively difficult to etch. Copper wiring may be formed through a damascene process, which may not require etching of Copper. A damascene process may include at least one of: forming a trench; forming a Copper layer inside the trench; and/or performing chemical mechanical polishing.

Copper may diffuse into other layers. A barrier layer may be formed inside a trench before filling the trench with Copper. A barrier layer may be formed of Tantalum (Ta). A Tantalum (Ta) film may not prevent diffusion of Copper. A barrier layer may be formed with Tantalum Nitride (TaN), which may prevent Copper diffusion better than a Tantalum (Ta) film. A Tantalum Nitride (TaN) film may have a relatively low adhesive strength with Copper.

A barrier layer may be formed with a dual film of Tantalum (Ta) and Tantalum Nitride (TaN). A dual fim of Tantalum (Ta) and Tantalum Nitride (TaN) may be both an adequate diffusion barrier and have adequate adhesive strength with Copper. A dual-film barrier layer may be formed by physical vapor deposition (PVD) and/or atomic layer deposition (ALD).

When a dual-film barrier layer is formed by PVD, overhanging may occur resulting in blockage of a via. Overhanging may occur if an aspect ratio (e.g. a ratio of depth to width) of a via is relatively large, which may lead to improper formation of a barrier layer.

When a dual-film barrier layer is formed by ALD, a TaN film and a Ta film may be formed by using different precursors, which may make the formation process relatively complicated. During ALD, since Carbon (C) and Oxygen (O) may be in a TaN film, the resistivity of the TaN film may become relatively large.

SUMMARY

Embodiments relates to a method of forming metal wiring (e.g. Copper wiring) in a semiconductor device. Embodiments include forming a dual film of Tantalum (Ta) and Tantalum Nitride (TaN), while substantially preventing overhanging.

Embodiments include at least one of the following: forming a TaN film over a semiconductor substrate by atomic layer deposition (ALD); and/or converting a TaN film into a Ta film. In embodiments a TaN film is converted into a Ta film by soaking the TaN film in a diluted Nitric Acid ($HNO_3$) solution.

Embodiments relate to forming metal wiring in a semiconductor device, including at least one of: forming an interlayer insulating film over a semiconductor substrate; forming a trench in an interlayer insulating film; forming a TaN film over an interlayer insulating film and on the inside of a trench; converting a TaN film into a Ta film by soaking a semiconductor substrate in a Nitric Acid ($HNO_3$) solution; and/or forming metal wiring over a Ta film. In embodiments, a TaN film may be formed by ALD.

BRIEF DESCRIPTION OF THE DRAWINGS

Example

Example

Example

Example

DETAILED DESCRIPTION

Figure 1:
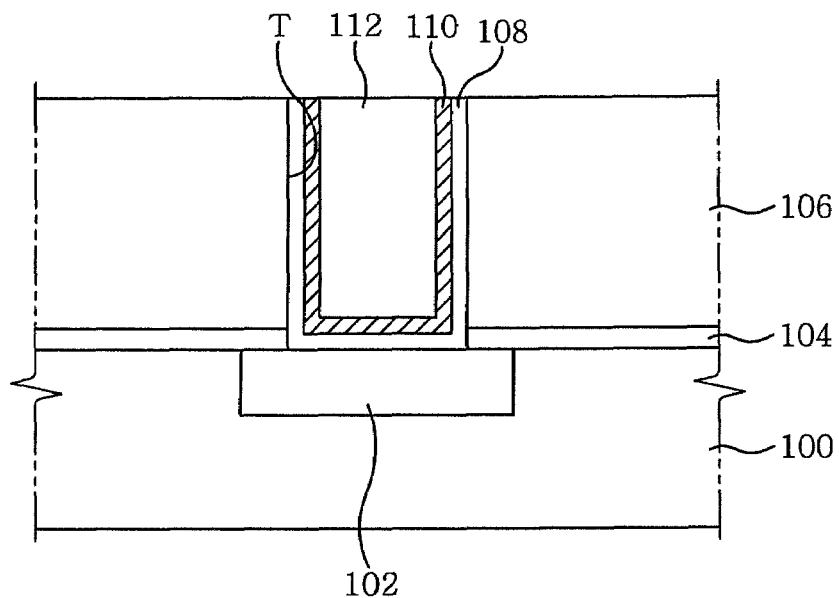
FIG. 1 illustrates a cross sectional view of metal wiring of a semiconductor device, in accordance with embodiments.

As illustrated in FIG. 1, etch stop layer 104 and interlayer insulating film 106 may be formed over substrate 100. Substrate 100 may include individual devices (not shown) or lower conductor 102.

Lower conductor 102 may be formed of Copper (Cu), Aluminum (Al), Tungsten (W), Silver (Ag), Gold (Au), Platinum (Pt), and/or similar material. Etching stop layer 104 may be made of SiN, $SiH_4$ and/or similar material. Interlayer insulating film 106 may be formed by depositing an organic or inorganic insulating material (e.g. a fluorine silicate glass (FSG), an undoped silicate glass (USG), $SiH_4$, and/or a tetra ethylortho silicate (TEOS) in a single layer or multiple layers. Interlayer insulating film 104 may be formed of a low-k material (e.g. black diamond (BD) having a dielectric constant less than approximately 3.0).

Trench T may be formed through etching stop layer 104 and/or interlayer insulating film 106, which may expose lower conductor 102 and/or substrate 100.

First barrier metal layer 108 and/or second barrier metal layer 110 may be formed inside trench T. First barrier metal layer 108 and/or second barrier metal layer 110 may be electrically coupled to metal wiring 112 and/or lower conductor 102.

First barrier metal layer 108 and second barrier metal layer 110 may prevent metal material of metal wiring 112 from diffusing into other layers (e.g. an insulating film). First barrier metal layer 108 and second barrier metal layer 110 may provide adequate adhesion between an insulating film and metal wiring.

First barrier metal layer 108 and second barrier metal layer 110 may form a dual barrier structure together by being formed sequentially. First barrier metal layer 108 may be formed of Tantalum Nitride (TaN). Second barrier metal layer 110 may be formed of Tantalum (Ta). Metal wiring 112 may include conductive material (e.g. Copper), which may have a low resistance.

Figure 2:
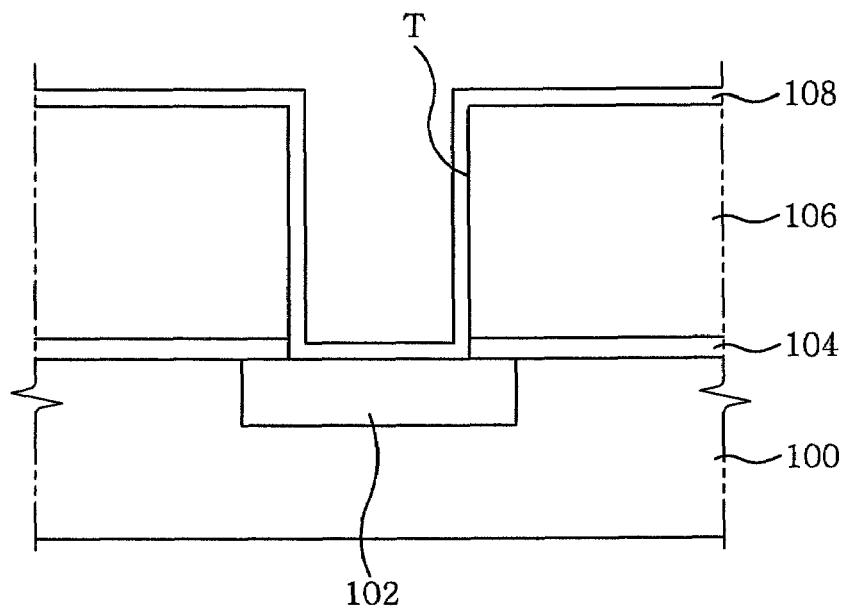
FIGS. 2 and 3 illustrate cross sectional views of metal wiring, in accordance with embodiments.

Example FIGS. 2 to 5 illustrate methods of forming metal wiring in a semiconductor device, in accordance with embodiments. As illustrated in FIG. 2, etch stop layer 104 may be formed over substrate 100. Interlayer insulating film 106 may be formed over substrate 100. Lower conductor 102 may be embedded in substrate 100. Trench T may be formed in interlayer insulating film 106. Trench T may be formed through a selective etching process and may use a photoresist film (not shown) to at least partially expose etch stop layer 104.

An exposed portion of etch stop layer 104 may be removed to at least partially expose lower conductor 102. TaN may be deposited by atomic layer deposition (ALD) when forming first barrier metal layer 108. When forming first barrier metal layer 108, substrate 100 may be maintained at a temperature between approximately 250° C. and approximately 300° C. First barrier metal layer 108 may have a thickness of about 1 nanometer.

When forming first barrier metal layer 108, at least one of the following reaction gases may be employed: ertbutylimido (trisdiethylamide)tantalum (TBTDET), pentakis(diethylamide)tantalum (PEEAT), pentakis(dimethylamide)tantalum (PDMAT), pentakis(ethylmethylamino)tantalum (PEAMT), and/or a similar reaction gas.

First barrier metal layer 108 may contain Carbon (C) and/or Oxygen (O) from formation processes. Substrate 100 may be submerged in a Nitric Acid ($HNO_3$) solution (e.g. a diluted Nitric Acid ($HNO_3$) solution). Submerging substrate 100 may substantially remove Nitrogen (N) from first barrier metal layer 108.

Figure 3:
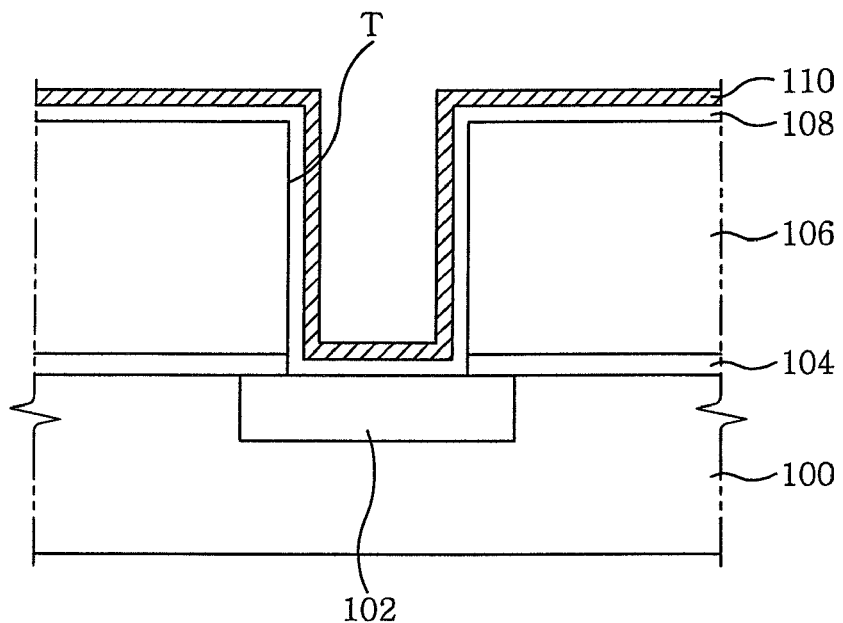

As illustrated in FIG. 3, at least a portion of first barrier metal layer 108 may be converted into Tantalum (Ta) to form second barrier metal layer 110, in accordance with embodiments. Second barrier metal layer 100 may be substantially made of Ta. Substrate 100 may be soaked in a diluted $HNO_3$ solution until the thickness of second barrier metal layer 110 is substantially the same as first barrier metal layer 108. Carbon (C) and/or Oxygen (O) in first barrier metal layer 108 may be removed by a $HNO_3$ solution. If Carbon (C) and/or Oxygen (O) in first barrier metal layer 108 are removed, a high purity of Tantalum Nitride (TaN) in first barrier metal layer 108 may remain.

Forming first barrier metal layer 108 with TaN and then forming second barrier metal layer 110 by soaking substrate 100 in a Nitric Acid ($HNO_3$) solution may be repeated multiple times, in accordance with embodiments. By repeating a formation process, a barrier metal layer structure of a desired thickness (e.g. from approximately 10 Å to approximately 300 Å) may be formed. As a formation process is repeated, first barrier metal layer 108 and second barrier metal layer 110 may be deposited alternately. The number of first barrier metal layers 108 and second barrier metal layers 110 may be equal to the number of repetitions performed.

As illustrated in FIG. 1, Copper may be deposited over second barrier metal layer 110, filling a trench defined by second barrier metal layer 110, in accordance with embodiments. By planarizing a substrate structure (e.g. through chemical mechanical polishing), metal wiring 112, barrier metal layer 108, and barrier layer 110 may be realized.

Figure 4:
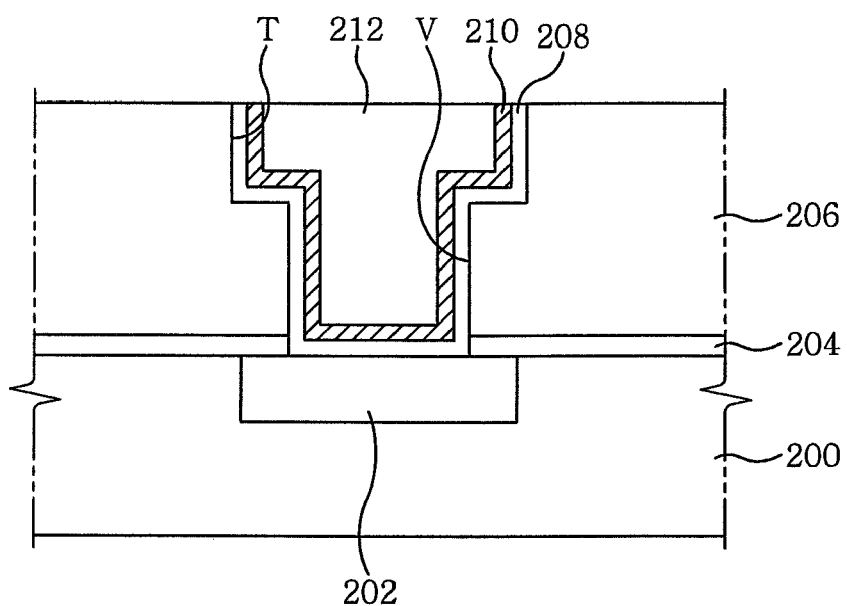
FIG. 4 illustrates a cross sectional view of metal wiring of a semiconductor device, in accordance with embodiments.

Example FIG. 4 illustrates a cross sectional view of metal wiring of a semiconductor device, according to embodiments. Etch stop layer 204 and/or interlayer insulating film 206 may be formed over a substrate 200. Substrate 200 may include individual devices (not shown) and/or lower conductor 202.

Lower conductor 202 may be formed of at least one of Copper (Cu), Aluminum (Al), Tungsten (W), Silver (Ag), Gold (Au), Platinum (Pt), and/or a similar material. Etch stop layer 204 may include at least one of SiN, $SiH_4$, and/or a similar material. Interlayer insulating film 206 may be formed by depositing at least one of an organic and/or inorganic insulating material. Deposited materials of interlayer insulating film 206 may include at least one of fluorine silicate glass (FSG), undoped silicate glass (USG), $SiH_4$, tetra ethylortho silicate (TEOS) in a single layer or multi layers, and/or similar materials. Interlayer insulating film 204 may be formed of a low-k material (e.g. black diamond (BD)) and may have a dielectric constant less than approximately 3.0.

Via V may be formed in etch stop layer 204 and/or interlayer insulating film 206. Via V may expose lower conductor 202 of substrate 200. Via V may be formed through trench T in interlayer insulating film 206. First barrier metal layer 208 and/or second barrier metal layer 210 may be deposited inside trench T and/or via V. Metal wiring 212 may be electrically connected to lower conductor 202.

First barrier metal layer 208 and second barrier metal layer 210 may prevent metal material from metal wiring 212 from diffusing into other layers (e.g. diffusion into an insulating film), in accordance with embodiments. First barrier metal layer 208 and second barrier metal layer 210 may enhance the adhesion of an insulating film and the metal wiring, in accordance with embodiments.

First metal barrier layer 208 and second barrier metal layer 210 may form a dual barrier structure by being deposited alternately. First barrier metal layer 208 may be formed of Tantalum Nitride (TaN). Second barrier metal layer 210 may be formed of Tantalum (Ta). Metal wiring 212 may include a conductive material (e.g. copper). The material of metal wiring 212 may have a relatively low resistance.

Figure 5:
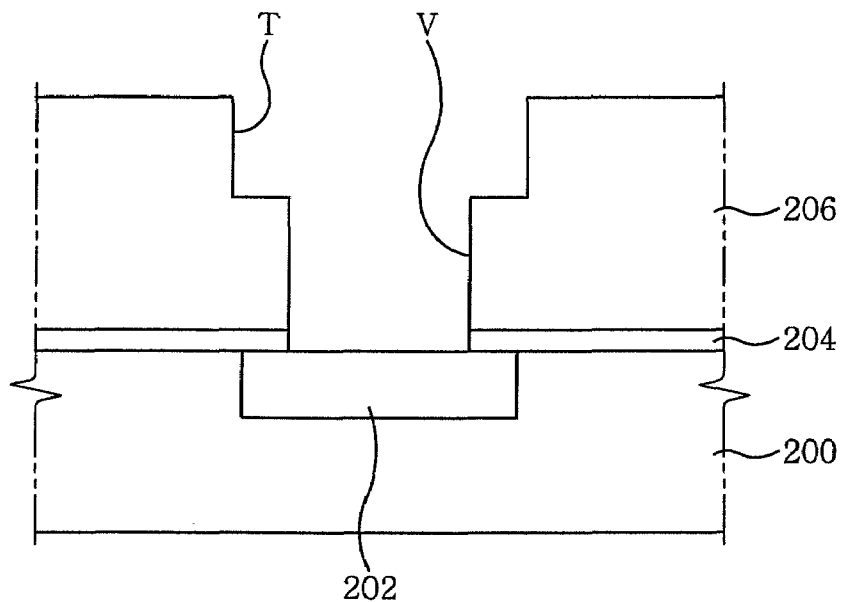
FIGS. 5 to 7 illustrate cross sectional views of a semiconductor device, in accordance with embodiments.
Figure 6:
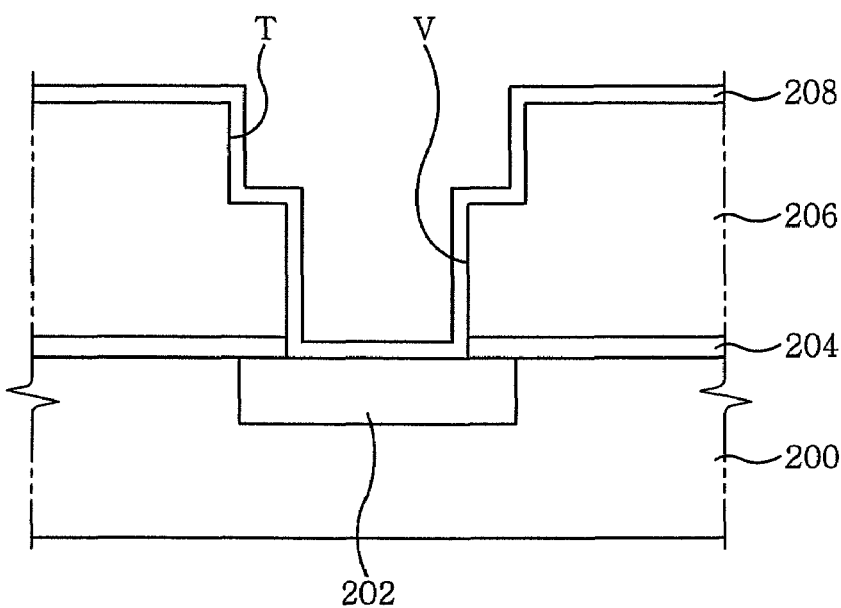
Figure 7:
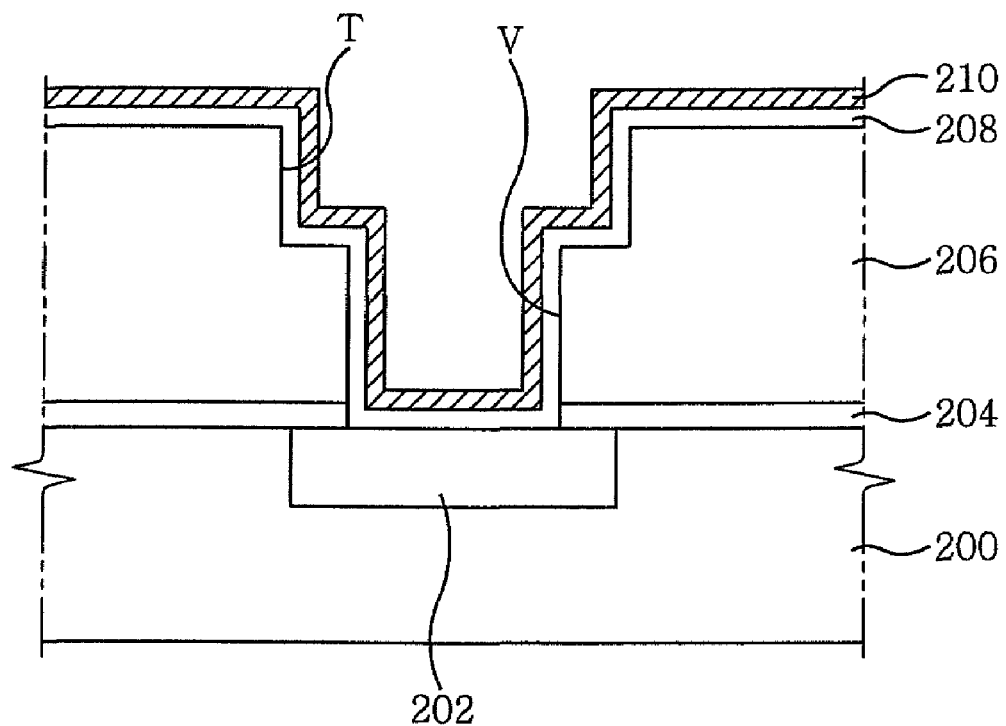

Example FIGS. 5 to 7 illustrate cross sectional views of a semiconductor device during formation of metal wiring, in accordance with embodiments. As illustrated in FIG. 5, etch stop layer 202 may be deposited over substrate 200. Interlayer insulating film 206 may be deposited over substrate 200. Substrate 200 may be embedded with lower conductor 202.

Via V may expose etch stop layer 204. Via V may be formed through interlayer insulating film 206 by a selective etching process using a photo-resist film (not shown). Trench T may be formed in interlayer insulating film 206 through a selective etching process using a photoresist film (not shown), such that via V is exposed through trench T. If interlayer insulating film 206 includes multiple layers, one of the multi layers of interlayer insulating film 206 may be used as an etch stop layer.

As illustrated in FIG. 5, an exposed portion of etch stop layer 204 may be removed to expose at least a portion of lower conductor 202. Tantalum Nitride (TaN) may be deposited by atomic layer deposition (ALD) to form first barrier metal layer 208. TaN may be deposited while maintaining substrate 200 at a temperature between about 250° C. and about 300° C., in accordance with embodiments. First barrier metal layer 208 may have a thickness of about 1 nanometer, in embodiments. First barrier metal layer 208 may incidently include Carbon (C) and Oxygen (O).

Formation of first barrier metal layer 208 may employ at least one of the following reaction gases: ertbutylimido(trisdiethylamide)tantalum (TBTDET), pentakis(diethylamide)tantalum (PDEAT), pentakis(dimethylamide)tantalum (PDMAT), pentakis(ethylmethylamino)tantalum (PEAMT), and/or a similar reaction gas.

Substrate 200 may be submerged into a Nitric Acid ($HNO_3$) solution (e.g. a diluted Nitric Acid solution). Nitrogen in first barrier metal layer 208 may be removed by a Nitric Acid solution. As illustrated in FIG. 7, by removing Nitrogen (N), at least a portion of first barrier metal layer 208 may be converted into Tantalum (Ta), thus forming second barrier metal layer 210, in accordance with embodiments. Second barrier metal layer 210 may be made of Ta. Substrate 200 may be soaked in a Nitric Acid ($HNO_3$) solution until the thickness of second barrier metal layer 210 is substantially the same as first barrier metal layer 208.

Carbon (C) and Oxygen (O), which may be in first barrier metal layer 208 may be removed by a Nitric Acid solution. If Carbon (C) and Oxygen (O) are removed, Tantalum Nitride (TaN) in first barrier metal layer 208 may have a relatively high purity.

A process of forming first barrier metal layer 208 of Tantalum Nitride (TaN) and forming second barrier metal layer 210 of Tantalum (Ta) may be repeated multiple times. A barrier metal layer structure may be formed (e.g. by multiple submerges) to have a thickness between about 10 Å to about 300 Å. As a formation process is repeated, first barrier metal layer 208 and second barrier metal layer 210 may be deposited alternately. The number of sets of first barrier metal layer 208 and second barrier metal layer 210 may be equal to the number of repetitions of a process.

As illustrated in FIG. 4, Copper may be deposited over second barrier metal layer 210. A Copper layer may fill a via and a trench defined by second barrier metal layer 210. A substrate structure may be planarizing (e.g. by chemical mechanical polishing) to form metal wiring 212, first barrier metal layer 208, and second barrier metal layer 210.

In embodiments, impurities (e.g. Carbon and Oxygen) may be removed from barrier metal layers. Impurities may have been formed during an atomic layer deposition process. Removal of impurities may reduce the resistivity of barrier film layers. Removal of impurities may allow barrier film layers to have a higher density.

In embodiments, since a Tantalum (Ta) film can be formed from a Tantalum Nitride (TaN) film, the processing steps may be cost effective due to relative simplicity.

It will be apparent to those skilled in the art that various modifications and variations can be made to embodiments. Thus, it is intended that embodiments cover modifications and variations thereof within the scope of the appended claims.

What is claimed is:

1. A method for forming a Tantalum Nitride (TaN) film over a semiconductor substrate; and
converting at least a portion of the Tantalum Nitride (TaN) film into a Tantalum (Ta) film.

2. The method of claim 1, wherein the method forms a thin film in a semiconductor device.

3. The method of claim 1, wherein said forming the Tantalum Nitride (TaN) film comprises forming the Tantalum Nitride (TaN) film through atomic layer deposition.

4. The method of claim 1, wherein said converting comprises soaking the Tantalum Nitride (TaN) film in a diluted Nitric Acid ($HNO_3$) solution.

5. The method of claim 4, wherein the concentration of the Nitric Acid ($HNO_3$) solution is less than approximately 1%.

6. The method of claim 1, wherein said forming the Tantalum Nitride (TaN) film comprises forming the Tantalum Nitride (TaN) to have a thickness less than approximately 1 nanometer.

7. The method of claim 1, wherein said forming the Tantalum Nitride (TaN) film and said converting the Tantalum Nitride (TaN) film are repeated at least two times.

8. The method of claim 7 wherein the total thicknesses of the Tantalum Nitride (TaN) films and the Tantalum (Ta) films is greater than approximately 10 Å and less than approximately 300 Å.

9. The method of claim 1, wherein the thickness of the Tantalum (Ta) film and the thickness of the Tantalum Nitride (TaN) film are approximately the same.

10. The method of claim 1, wherein said forming the Tantalum Nitride (TaN) comprises maintaining the substrate at a temperature greater than approximately 250° C. and less than 300° C.

11. A method of forming metal wiring in a semiconductor device, comprising:
forming an interlayer insulating film over a semiconductor substrate;
forming a trench in the interlayer insulating film;
forming a Tantalum Nitride (TaN) film over the interlayer insulating film and inside the trench;
converting at least a portion of the Tantalum Nitride (TaN) into a Tantalum (Ta) film; and
forming metal wiring over the Tantalum (Ta) film.

12. The method of claim 11, wherein said forming the Tantalum Nitride (TaN) film comprises atomic layer deposition of Tantalum Nitride (TaN).

13. The method of claim 11, wherein said converting at least a portion of the Tantalum Nitride (TaN) film into the Tantalum (Ta) film comprises soaking the semiconductor substrate in a Nitric Acid ($HNO_3$) solution.

14. The method of claim 13, wherein the concentration of the Nitric Acid ($HNO_3$) solution is less than approximately 1%.

15. The method of claim 11, wherein the Tantalum Nitride (TaN) film has a thickness less than approximately 1 nanometer.

16. The method of claim 11, wherein said forming the Tantalum Nitride (TaN) film and said converting the Tantalum Nitride (TaN) film into the Tantalum (Ta) film are repeated at least two times.

17. The method of claim 16, wherein the total thicknesses of the Tantalum Nitride (TaN) films and the Tantalum (Ta) films is greater than approximately 10 Å and less than approximately 300 Å.

18. The method of claim 11, wherein the thickness of the Tantalum (Ta) film and the thickness of the Tantalum Nitride (TaN) film are approximately the same.

19. The method of claim 11, wherein said forming the Tantalum Nitride (TaN) film comprises maintaining the substrate at a temperature greater than approximately 250° C. and less than 300° C.

* * * * *